(12) United States Patent  
Finkbeiner et al.

(10) Patent No.: US 8,198,130 B2  
(45) Date of Patent: Jun. 12, 2012

(54) CHIP MODULE AND METHOD FOR PRODUCING A CHIP MODULE HAVING PLAINS OF EXTENSIONS FOR CHIP AND SUBSTRATE

(75) Inventors: Stefan Finkbeiner, Gomaringen (DE); Frieder Haag, Wannweil (DE); Hans-Peter Baer, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 12/721,785

(22) Filed: Mar. 11, 2010

(65) Prior Publication Data  
US 2010/0252939 A1 Oct. 7, 2010

(30) Foreign Application Priority Data  
Mar. 27, 2009 (DE) .......................... 10 2009 001 932

(51) Int. Cl.  
*H01L 21/00* (2006.01)

(52) U.S. Cl. .......................... 438/106; 438/108; 438/109

(58) Field of Classification Search .................. 438/106, 438/108, 109  
See application file for complete search history.

(56) References Cited

U.S. PATENT DOCUMENTS

| 5,261,279 | A  | * | 11/1993 | Wolf et al. .................... 361/280 |
| 7,323,779 | B2 | * | 1/2008  | Ibaraki ......................... 257/737 |
| 7,838,979 | B2 | * | 11/2010 | Oh ............................... 257/686 |
| 2006/0087006 | A1 | * | 4/2006 | Shirasaka et al. ............. 257/619 |
| 2007/0099349 | A1 | * | 5/2007 | Adachi et al. ................. 438/123 |
| 2007/0152315 | A1 | * | 7/2007 | Kwak et al. ................... 257/686 |

FOREIGN PATENT DOCUMENTS  
DE 102 50 321 6/2003  
* cited by examiner

*Primary Examiner* — James Mitchell  
(74) *Attorney, Agent, or Firm* — Kenyon & Kenyon LLP

(57) ABSTRACT

A chip module having a substrate and at least one chip connected to the substrate is provided, the substrate featuring a first main plane of extension and the chip featuring a second main plane of extension, and an acute angle being provided between the first main plane of extension and the second main plane of extension, and the substrate also comprising a mold housing.

10 Claims, 2 Drawing Sheets

CHIP MODULE AND METHOD FOR PRODUCING A CHIP MODULE HAVING PLAINS OF EXTENSIONS FOR CHIP AND SUBSTRATE

BACKGROUND INFORMATION

Chip modules are generally familiar. For example, German Patent Application No. DE 102 50 321 describes an array of sensors, the sensors being disposed in part on a plane that is oriented at an incline with respect to a plane defined by a sensor platform, so that an acute angle is provided between the sensor platform and the main plane of extension of the sensor disposed on the inclined plane. In this context, the sensor platform includes in particular the surface of a printed circuit board.

SUMMARY OF THE INVENTION

In comparison with the related art, the chip module according to the present invention and the method according to the present invention for producing a chip module have the advantage that it is possible to dispose a chip at an acute angle relative to the first main plane of extension of the chip module in a comparatively simple and cost-effective manner and at the same time the chip is packaged by the mold housing and thus is protected from damaging external influences. The substrate thus simultaneously functions as a chip carrier and connector element on the one hand, and as chip packaging on the other hand. In an advantageous manner, this allows for a chip array that may be implemented in a cost-effective manner, and in which an inclined position of at least one chip relative to the first main plane of extension is required or advantageous. For example, in a magnet module, a magnetic field measurement in different planes is necessary in order to measure a spatial magnetic field. Furthermore, the inclined position of the chip makes it possible to save space parallel to the first main plane of extension. In accordance with the present invention, the first main plane of extension comprises in particular the plane in which the substrate features its main extension. Furthermore, the first main plane of extension also comprises the plane that functions as the connector plane of the substrate. The first main plane of extension is thus also defined by the disposition of bond contacts on the substrate and/or by the main extension of a printed circuit board, on which the substrate is bonded, for example. In an extreme case, the position of the first main plane of extension could also deviate from the position of the main extension of the substrate. The chip includes in particular an electronic and/or microelectronic sensor, preferably an acceleration sensor, a rotation rate sensor, a magnetic field sensor, a pressure sensor, a photo sensor, and/or an electromagnetic antenna. In this context, the sensor includes a sensor substrate of semiconductor material, while the mold housing includes a plastic in particular. The acute angle preferably lies between 5 degrees and 40 degrees, particularly preferably between 10 and 30 degrees and particularly preferably essentially at 25 degrees.

In accordance with a preferred refinement, it is provided that the chip and/or the chip module comprises an SMD component, the chip featuring in particular contact surfaces that are disposed on a side of the chip facing away from the substrate. Thus, particularly advantageously, it is possible to fit the chip module to printed circuit boards, for example, in a relatively simple and cost-effective manner, in particular in automatic fitting methods. The solderable connection surfaces (in the following, also called contact surfaces) of the chip are preferably connected in an electrically conductive manner to the solderable connection surfaces (in the following, also called bond contacts) of the chip module, so that preferably it is possible to solder the connection surfaces of the chip module to a printed circuit board in a simple manner via soldering globules, and thus an electrical contacting of the chip is made possible. Alternatively, it is conceivable to bond the connection surfaces of the chip module to a printed circuit board via an electrically conductive adhesive agent.

According to an additional preferred refinement, it is provided that the chip is embedded at least partially in the substrate, in particular the contact surfaces being provided in an exposed manner with regard to the substrate. In this context, the chip is particularly advantageously fixed mechanically by the substrate and protected from external influences, such as dirt, mechanical stress, gases, and chemicals. At the same time, an electrical contacting of the chip is made possible via the contact surfaces that are exposed with regard to the substrate. In this context, exposed with regard to the substrate means in particular that only the substrate does not cover the contact surfaces. However, for contacting, routing, and protection of the contact surfaces, an at least partial covering of the chip is preferably provided and in particular an at least partial covering of the contact surfaces through insulation layers, protective layers, conductive layers, and/or dielectric layers.

According to an additional preferred refinement, it is provided that the substrate features bond contacts that are preferably connected to a printed circuit board in an electrically conductive manner, so that in an advantageous manner, it is possible to produce a mechanically stable, electrically conductive, and/or machine-manufacturable contact between the printed circuit board and the substrate.

According to an additional preferred refinement, it is provided that the substrate features at least one additional chip, a third main plane of extension of the additional chip being oriented essentially parallel to the first main plane of extension. Thus, it is particularly advantageously possible to implement in a simple manner an array of chips and additional chips, which include sensors in particular, in different planes, so that it is possible to measure a spatial magnetic field via chips and additional chips in the form of magnetic field sensors, for example. Furthermore, it is conceivable that the additional chip additionally also or alternatively exclusively includes an electronic read-out element, evaluation element, control element, calculation element, storage element, transmission element, and/or receiving element.

According to an additional preferred refinement, it is provided that the chip module features a conductive layer that in particular is disposed on the side of the substrate featuring the chip and in particular comprises an electrically conductive connection between a contact surface and a bond contact and/or between a contact surface and an additional contact surface of the additional chip, so that in an advantageous manner an electrical evaluation or control of the chip or of the additional chip is made possible via the contacting of the bond contacts. Furthermore, it is possible to network a plurality of chips and/or a plurality of additional chips. The conductive layer includes in particular a conductive coating, which coats the chip module, the substrate, the chip, and/or the additional chip. Preferably, the thickness of the conductive layer is substantially thinner than the chip or the substrate thickness.

An additional subject matter of the present invention is a method for producing a chip module, a prepatterned carrier element being fitted with at least one chip in a first method step, a molding mass for producing the substrate being disposed on the chip in a second method step such that an acute angle is provided between a first main plane of extension of the substrate and a second main plane of extension of the chip, and the substrate along with the chip being detached from the carrier element in a third method step. In an advantageous manner, the method according to the present invention allows for the sensor module to be manufactured in a significantly simpler and more cost-effective manner as compared to the related art. In particular, in the second method step, both a substrate for mechanically mounting and fixing the chip and a packaging for protection and for insulating the chip from external influences are manufactured in only one single step, in a standardized manufacturing method that is relatively easy to control and is cost-effective. At the same time, an inclination of the second main plane of extension relative to the connection plane is implemented, with the advantages discussed in detail above. In an advantageous manner, the carrier element may be reused to manufacture additional sensor modules according to the present invention. Furthermore, the method according to the present invention allows for chips to be disposed at different angles to the connection plane in a mold housing that features standard housing dimensions and that thus may be used in standard fitting methods or on standard printed circuit boards. In the second method step, an epoxy resin is preferably used as a molding mass, which is preferably deposited and cured in a molding method, such as transfer molding, compression molding, or liquid molding, particularly for the production of the substrate. Alternatively, a resin composite is laminated on as a cohesive layer (sheet molding), so that a coherent composite of a carrier plate and a plastic layer having embedded chips forms in an advantageous manner.

In accordance with a preferred refinement, it is provided that in a zeroth method step, which temporally is performed before the first method step, the carrier element is prepatterned in such a manner that a surface region to be fitted with the chip features an acute angle relative to a fourth main plane of extension of the carrier element. In an advantageous manner, the chip is thus to be disposed at any angle to the first main plane of extension and/or a plurality of chips is to be disposed in any three-dimensional pattern.

In accordance with an additional preferred refinement, it is provided that in the zeroth method step, the surface region of the carrier element that is to be fitted with the chip is coated with a film, in particular in a lamination procedure, and/or the carrier element is manufactured from a film that is prepatterned, in particular by hot stamping. In a particularly advantageous manner, the film comprises a film that adheres in particular on both sides, via which the chip is pre-fixed to the carrier element. In order to prevent the film from creasing, the film is advantageously preformed by hot stamping. If the strength or thickness of the film is sufficient, the three-dimensional pattern is produced preferably only in the film, by hot stamping. In this case, the carrier element includes either only the prepatterned film, or the prepatterned film is alternatively additionally deposited on a planar carrier, so that the carrier element includes both the film and the planar carrier. In a particularly preferable manner, the carrier element includes a three-dimensional prepatterned semiconductor wafer that is particularly preferably processed in standard semiconductor methods.

According to an additional preferred refinement, it is provided that the carrier element is fitted with at least one additional chip in the first method step, preferably a third main plane of extension of the additional chip being oriented essentially parallel to the first and/or fourth main plane of extension. Thus, it is advantageously possible to dispose a plurality of chips and/or additional chips in a three-dimensional pattern, which is preferably oversprayed as the total package along with the molding mass for forming the substrate.

In accordance with an additional preferred refinement, it is provided that a conductive layer is disposed on the substrate, the chip, and/or the additional chip in a fourth method step, and/or that the substrate is bonded to a printed circuit board in a fifth method step. Particularly advantageously, a plurality of chips and/or additional chips are thus connected together to the printed circuit board in an electrically conductive manner. The conductive layer is preferably deposited and/or patterned in standard semiconductor methods or using commercial standard thin-layer technology.

In accordance with an additional preferred refinement, it is provided that the carrier element is fitted with a plurality of chips and/or additional chips in the first method step, and/or that the substrate is divided to separate a plurality of chip modules in a sixth method step that is performed temporally in particular before the fifth method step. In an advantageous manner, it is thus possible to manufacture the chip module according to the present invention in a relatively large quantity in a particularly cost-effective manner. Preferably, the fifth method step includes a sawing and/or a laser separation process.

DETAILED DESCRIPTION

Figure 1:
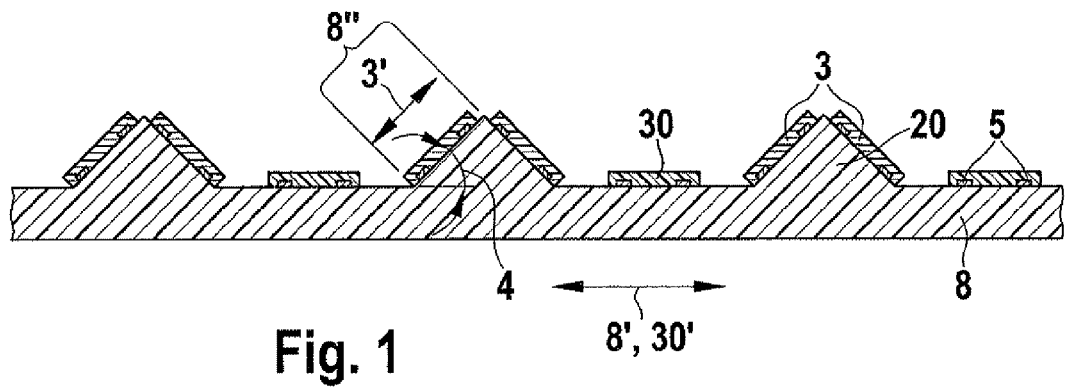
FIGS. 1-4 show schematic sectional views of a first, second, third, and fourth precursor pattern for manufacturing a chip module according to the present invention in accordance with a first specific embodiment of the present invention.

In the various figures, the same parts are always denoted by the same reference numerals and, therefore, are also typically only named or mentioned once in each case.

In FIGS. 1 through 4, schematic sectional views of a first, second, third, and fourth precursor pattern for manufacturing a chip module 1 according to the present invention in accordance with a first specific embodiment of the present invention are shown, a first method step being illustrated with the aid of the first specific embodiment shown in FIG. 1, in which a prepatterned carrier element 8 is fitted with chips 3 and additional chips 30. Chips 3 and additional chips 30 are respectively designed as SMD components and feature contact surfaces 5 and additional contact surfaces 50 on their sides facing carrier element 8. Carrier element 8 has a three-dimensional pattern 20, which is manufactured in particular by hot stamping of a foil in a preceding zeroth method step not shown, on its side fitted with chips 3 and additional chips 30. Patterns 20 are designed such that a second main plane of extension 3' of chips 3 forms an acute angle 4 with a fourth main plane of extension 8' of carrier element 8, while third main plane of extension 30' of additional chips 30 is essentially oriented parallel to fourth main plane of extension 8'. Chips 3 and additional chips 30 are in particular bonded to carrier element 8 by a foil that adheres on both sides.

Figure 2:
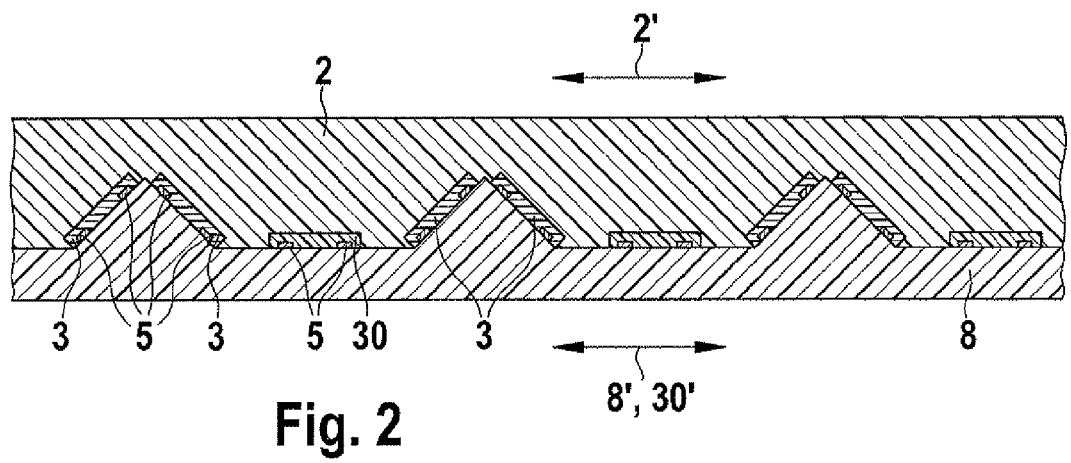
Figure 3:
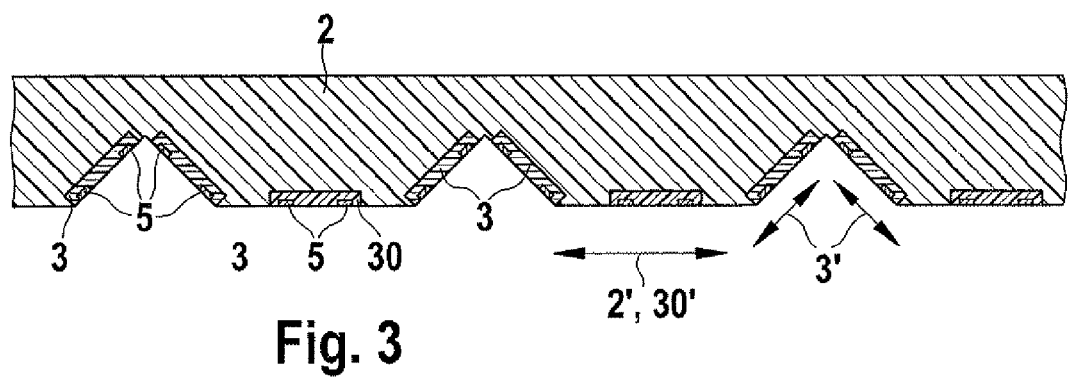

A second method step is shown with the aid of the second precursor pattern illustrated in FIG. 2, carrier element 8, chips 3, and additional chips 30 being sprayed with a molding mass to form a substrate 2. Chips 3 and additional chips 30 are embedded in substrate 2 in such a manner that only the sides of chips 3 and of additional chips 30' that face carrier element 8, and thus also contact surfaces 5 and additional contact surfaces 50, are not covered by the molding mass. Second main plane of extension 3' of chips 3 also forms an obtuse angle 4 with a first main plane of extension 2' of substrate 2. With the aid of the third precursor pattern illustrated in FIG. 3, a third method step is illustrated, in which substrate 2 is detached from carrier element 8 along with chips 3 and additional chips 30 after the hardening of the molding mass. The foil that adheres on both sides is designed in a relatively weakly adhering way, so that contact surfaces 5 and additional contact surfaces 50 are now exposed, and in a subsequent fourth method step, which is illustrated with the aid of the fourth precursor pattern illustrated in FIG. 4, they are covered with a conductive layer 7 and possibly with additional protective layers, insulation layers, and/or dielectric layers. Conductive layer 7 is preferably patterned in such a manner that on the side of substrate 2 featuring chips 3 and additional chips 30, bond contacts 6 are produced that are connected in an electrically conductive manner to contact surfaces 5 of chips 3 and of additional chips 30. For routing, a dielectric, such as a polymide, for example, is also optionally deposited on substrate 2, and is patterned using a photolithographic process. Bond contacts 6 form an SMD component from the fourth precursor pattern, which can be mechanically fitted to a printed circuit board. Additionally, electrically conductive connections between contact surfaces 5 of chips 3 and contact surfaces 5 of additional chips 30 are optionally produced.

Figure 4:
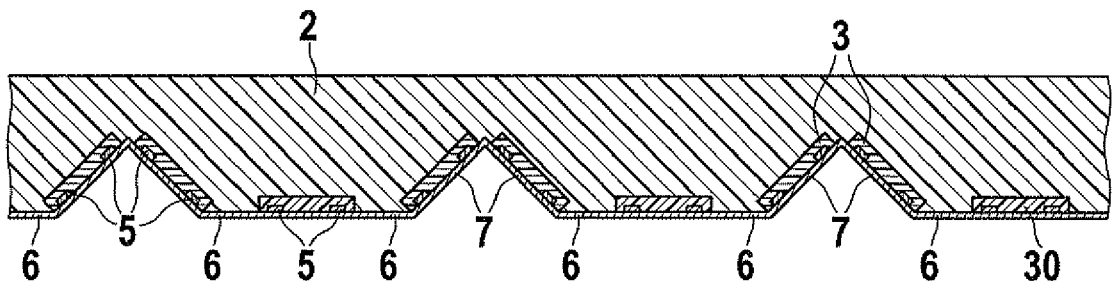
Figure 5:
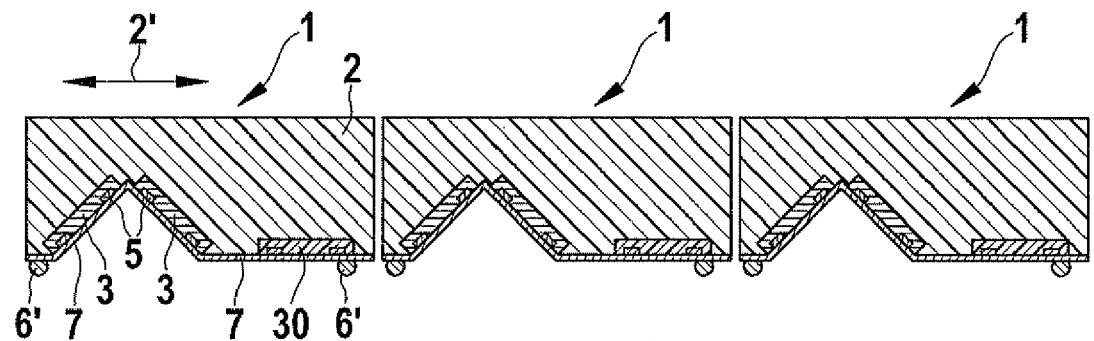
FIG. 5 shows a schematic sectional view of a chip module according to the present invention in accordance with the first specific embodiment of the present invention.

FIG. 5 illustrates schematic sectional views of three chip modules 1 according to the present invention in accordance with the first specific embodiment of the present invention, the first specific embodiment essentially being equivalent to the fourth precursor pattern shown in FIG. 4, substrate 2 being cut apart in a fifth method step, in a sawing or laser separation process, for example, so that three identical chip modules 1 are produced. Bond contacts 6 of three chip modules 1 are respectively provided with soldering globules 6', so that chip modules 1 may be soldered onto a printed circuit board as an SMD component in a sixth method step, which is not shown. In this context, each chip module 1 has two chips 3 and an additional chip 30, the two chips 3 being disposed on different pattern surfaces, so that all three modules have a different orientation to each other.

Figure 6:
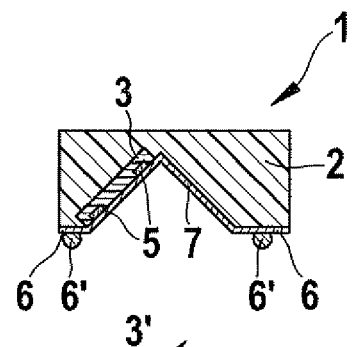
FIG. 6 shows a schematic sectional view of a chip module according to the present invention in accordance with a second specific embodiment of the present invention.
Figure 6:
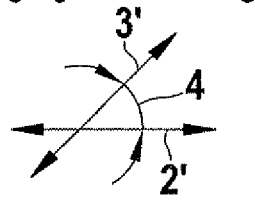

FIG. 6 shows a schematic sectional view of a chip module 1 according to the present invention, in accordance with a second specific embodiment of the present invention, the second specific embodiment essentially being identical to the first specific embodiment illustrated in FIG. 5, the second specific embodiment featuring only one single chip 3 and no additional chips 30, in contrast to the first specific embodiment.

What is claimed is:

1. A chip module comprising:
    a substrate including a mold housing, the substrate having a first main plane of extension; and
    at least one chip stationarily connected to the substrate, the chip having a second main plane of extension, an acute angle being defined between the first main plane of extension and the second main plane of extension, the second main plane of extension determined by the orientation of the substrate; wherein no material is between the first and second main plain of extension that define the acute angle.

2. The chip module according to claim 1, further comprising an SMD component, the chip having contact surfaces situated on a side of the chip facing away from the substrate, the substrate including bond contacts connected to a printed circuit board in an electrically conductive manner.

3. The chip module according to claim 2 wherein the chip is at least partially embedded in the substrate, the contact surfaces being provided in an exposed manner with regard to the substrate.

4. The chip module according to claim 1, wherein the substrate includes at least one additional chip, a third main plane of extension of the additional chip being oriented substantially parallel to the first main plane of extension.

5. The chip module according to claim 4, further comprising a conductive layer situated on a side of the substrate having the chip and including an electrically conductive connection at least one of (a) between a contact surface and a bond contact and (b) between a contact surface and an additional contact surface of the additional chip.

6. A method for manufacturing a chip module, comprising:
    fitting a prepatterned carrier element with at least one chip in a first method step;
    situating a molding mass for producing a substrate on the chip in a second method step such that an acute angle is provided between a first main plane of extension of the substrate and a second main plane of extension of the chip; and
    detaching the substrate from the carrier element along with the chip in a third method step; wherein no material is between the first and second main plain of extension that define the acute angle.

7. The method according to claim 6, wherein in a zeroth method step, which temporally is performed before the first method step, at least one of (a) the carrier element is prepatterned in such a manner that a surface area to be fitted with the chip has an acute angle relative to a fourth main plane of extension of the carrier element, (b) the surface area of the carrier element to be fitted with the chip is coated with a film, and (c) the carrier element is produced from a film that is prepatterned by hot stamping.

8. The method according to claim 7, wherein in the first method step, the carrier element is fitted with at least one additional chip, a third main plane of extension of the additional chip being oriented substantially parallel to at least one of the first and fourth main plane of extension.

9. The method according to claim 8, wherein a conductive layer is situated on at least one of the substrate, the chip, and the additional chip in a fourth method step, and the substrate is at least one of soldered and bonded to a printed circuit board in a fifth method step.

10. The method according to claim 9, wherein the carrier element is fitted with a plurality of chips and/or additional chips in a first method step, and the substrate is divided to separate a plurality of chip modules in a sixth method step that is performed temporally before the fifth method step.

* * * * *